United States Patent
Taylor et al.

(10) Patent No.: US 6,448,748 B1
(45) Date of Patent: Sep. 10, 2002

(54) HIGH CURRENT AND HIGH ACCURACY LINEAR AMPLIFIER

(75) Inventors: Michael F. Taylor, Mpls; Teck-Shiun Lim, Brooklyn Park, both of MN (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 09/797,511

(22) Filed: Mar. 1, 2001

(51) Int. Cl.[7] .................................................. G05F 1/40
(52) U.S. Cl. ....................................................... 323/280
(58) Field of Search ................................ 323/274, 276, 323/280, 281, 282

(56) References Cited

U.S. PATENT DOCUMENTS

| | | | |
|---|---|---|---|
| 3,670,230 A | 6/1972 | Rooney et al. | |
| 4,574,232 A | 3/1986 | Petty | |
| 4,586,000 A | * 4/1986 | Wagner | 330/252 |
| 4,710,861 A | 12/1987 | Kanner | |
| 4,940,929 A | 7/1990 | Williams | |
| 4,952,863 A | 8/1990 | Sartwell et al. | |
| 5,103,388 A | 4/1992 | Williams et al. | |
| 5,130,635 A | 7/1992 | Kase | |
| 5,479,337 A | * 12/1995 | Voigt | 363/131 |
| 5,686,820 A | 11/1997 | Riggio, Jr. | |
| 5,712,774 A | 1/1998 | Uramoto | |
| 5,757,203 A | 5/1998 | Brown | |
| 5,773,990 A | 6/1998 | Wilstrup et al. | |
| 5,789,933 A | 8/1998 | Brown et al. | |
| 5,789,934 A | 8/1998 | Kolkowski et al. | |
| 5,886,892 A | 3/1999 | Radley et al. | |
| 5,914,870 A | 6/1999 | Noble et al. | |
| 5,917,318 A | 6/1999 | Kamata | |
| 5,925,278 A | 7/1999 | Hirst | |
| 5,932,996 A | 8/1999 | Liepe et al. | |
| 6,356,061 B1 | * 3/2000 | Perillo | 323/274 |
| 6,046,577 A | 4/2000 | Rincon-Mora et al. | |
| 6,087,843 A | 7/2000 | Pun et al. | |
| 6,222,709 B1 | * 4/2001 | Baba | 361/18 |

* cited by examiner

Primary Examiner—Adolf Deneke Berhane
(74) Attorney, Agent, or Firm—Lance M. Kreisman

(57) ABSTRACT

A high-accuracy linear amplifier is disclosed for sinking or sourcing current to or from a load. The linear amplifier includes input circuitry for receiving a predetermined input signal and rectifier circuitry. The rectifier circuitry is disposed at the output of the input circuitry and is operative in response to the input signal to generate a source/sink command signal. Output stage circuitry is coupled to the rectifier circuitry and includes a current sink transistor and a current source transistor. The output stage circuitry is responsive to the command signal to sink or source current through one of the respective transistors. The amplifier further includes feedback circuitry coupled between the output of the output stage circuitry and the input circuitry to provide an error signal for modifying the input signal. Bias circuitry maintains the non-conducting transistor in an on state during the sourcing or sinking of current.

20 Claims, 9 Drawing Sheets

HIGH CURRENT AND HIGH ACCURACY LINEAR AMPLIFIER

FIELD OF THE INVENTION

The invention relates generally to automatic test equipment and more particularly a high current and high accuracy linear amplifier for use with a semiconductor tester power supply to provide precise voltage and current levels to a high-speed device-under-test (DUT).

BACKGROUND OF THE INVENTION

Semiconductor device manufacturing typically includes test processes at both the wafer and packaged-device levels. The testing is normally carried out by automatic test equipment ATE that simulates a variety of operating conditions to verify the functionality of each device. As is well known in the art, semiconductor devices generally require a source of power in order to function.

As the speeds of modem semiconductors increase, the dynamic current requirements necessary to operate the devices also increase. This is due to many variables, such as the reduction in logic level voltages, higher switching speeds, higher transistor counts, transistor technology, etc. As it stands, modem microprocessors may draw from a few hundred milli-amps in static conditions, to over two-hundred amps during dynamic conditions over the course of a few nanoseconds.

Unlike power supplies that are typically employed in, for example, a personal computer, power supplies for automatic test equipment applications generally must be accurate, fast, and programmable. Device manufacturers often test a semiconductor part to characterize extreme operating ranges, and desire high accuracy to enable proper "binning" of the highest speed devices. Just a few millivolts of inaccuracy can result in a gigahertz speed device sorted in a lower speed bin. Because higher speed devices command significantly higher prices for manufacturers, power supply accuracy plays an important role in the overall test process.

Conventional DUT power supplies typically include a switching DC-DC converter to step-down a high voltage to a lower DUT operating voltage, and a linear amplifier to condition the output of the converter. Digital circuitry provides a digital control mechanism over the analog-based converter and linear amplifier circuitry. Because high accuracy is an important consideration for ATE applications, the linear amplifier portion of the DUT power supply plays a key role in test success.

Typical linear amplifiers employed in conventional ATE applications are often of the push-pull emitter or source follower configuration (output follows the emitter for BJT's, or at the source for FET's), similar to audio amplifiers. Biasing this type of amplifier configuration often entails substantial warmup to minimize distortion (at one extreme) or significant power dissipation to keep the amplifier "always on". It would be desirable to minimize both distortion and power dissipation, yet maintain the output transistors in an "on" state.

Moreover, during the testing of devices, semiconductor manufacturers often need to know how much current the DUT demands. Conventionally, this is carried out by a series resistor disposed in the output of the linear amplifier, and monitored by an instrumentation amplifier. As power supply currents increase, the value of the sense resistor must go down, and the power rating up. A large resistor capable of monitoring 100 amperes or more will typically be wire wound, introducing substantial inductance. Inductance tends to resist instantaneous changes in current. Thus, a new way of monitoring current would be a desirable alternative to the conventional manner described above.

What is needed and heretofore unavailable is a high accuracy linear amplifier that is adaptable for use in a DUT power supply and that can minimize distortion and power dissipation. The linear amplifier of the present invention satisfies these needs.

SUMMARY OF THE INVENTION

The linear amplifier of the present invention provides high speed voltage and current supply performance to devices-under-test while maintaining stringent accuracy requirements. As a result, semiconductor device manufacturers can maximize device yields and correspondingly reduce test costs.

To realize the foregoing advantages, the invention in one form comprises a high-accuracy linear amplifier for sinking or sourcing current to or from a load. The linear amplifier includes input circuitry for receiving a predetermined input signal and rectifier circuitry. The rectifier circuitry is disposed at the output of the input circuitry and is operative in response to the input signal to generate a source/sink command signal. Output stage circuitry is coupled to the rectifier circuitry and includes a current sink transistor and a current source transistor. The output stage circuitry is responsive to the command signal to sink or source current through one of the respective transistors. The amplifier further includes feedback circuitry coupled between the output of the output stage circuitry and the input circuitry to provide an error signal for modifying the input signal. Bias circuitry maintains the non-conducting transistor in an on state during the sourcing or sinking of current.

In another form, the invention comprises a bias circuit for maintaining a linear amplifier output stage in an on state. The amplifier output stage includes an FET with respective gate, drain, and source terminals and configured as a common-source amplifier. The bias circuit includes a voltage rail, a set resistor coupled to said voltage rail, a current source disposed in series with the set resistor to establish a fixed voltage drop across the set resistor, and a sense resistor disposed between the voltage rail and the FET source terminal. The circuit further includes an op amp having a positive input coupled to the fixed voltage drop, a negative input coupled in a feedback path to the FET source terminal and an output coupled to the FET gate terminal. The op amp cooperates with the current source such that the bias current generated in the FET is independent of drive current, load current and FET heating.

In yet another form, the invention comprises a rectifier circuit for directing a command voltage to source or sink current to or from respective source or sink FET output stage transistors. The rectifier circuit includes a current source path including a current source transistor, a current sink path including a current sink transistor, and op amp circuitry coupled to the paths to establish a common node between the transistors. The respective source and sink transistors operative in response to the command voltage to cause current flow through one of the paths depending on the polarity of the command signal.

In a further form, the invention comprises a modular output stage for use in a linear amplifier. The modular output stage includes respective source current and sink current paths. The paths have respective source and sink transistors disposed in a common-source configuration and respective source and sink impedances to generate a predetermined transconductance. Respective source current and sink current op amps are coupled to the respective source current and sink current transistors. Each of the op amps are responsive to a command signal to source or sink current through the source or sink transistors.

In yet another form, the invention comprises an indirect current monitor circuit for indicating changes in current output from a device-under-test power supply. The power supply includes respective positive and negative voltage rails, at least one output stage, and bias circuitry for biasing the output stage. The indirect current monitor circuit includes a first instrumentation amplifier coupled to the positive bias circuitry and a second instrumentation amplifier coupled to the negative bias circuitry. A summing amplifier having an input coupled to the outputs of the first and second instrumentation amplifiers detects changes in current in the positive and negative bias circuits such that the changes in current in the bias circuits represent changes in current from the at least one output stage.

Other features and advantages of the present invention will be apparent from the following detailed description when read in conjunction with the accompanying drawings.

BRIEF DESCRIPTION OF THE DRAWINGS

The invention will be better understood by reference to the following more detailed description and accompanying drawings in which.

DETAILED DESCRIPTION OF THE INVENTION

Figure 1:
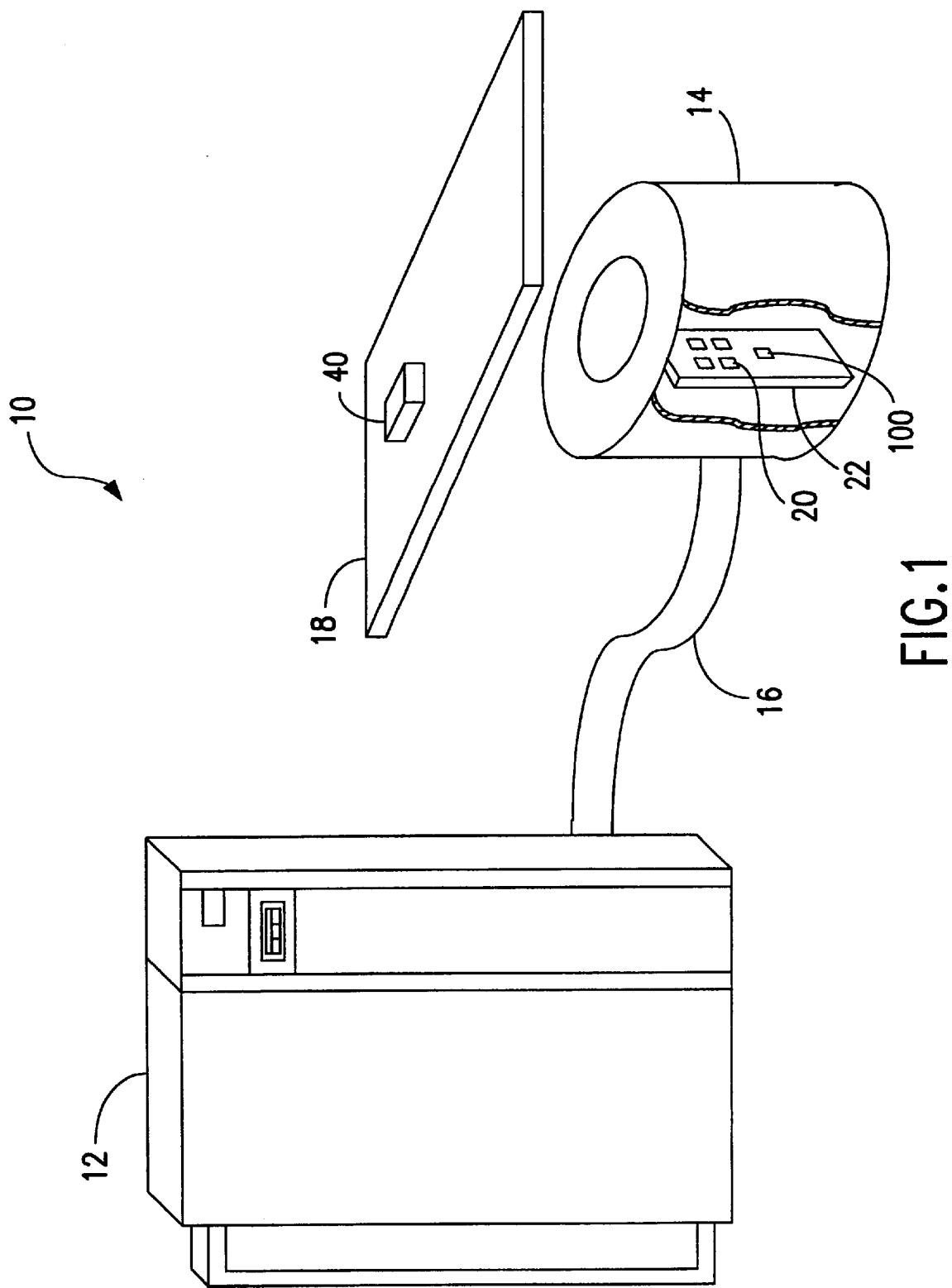
FIG. 1 is a block diagram of a semiconductor tester according to one form of the present invention.

Referring now to FIG. 1, the high-current and high-accuracy linear amplifier of the present invention, generally designated 50 (FIG. 3), is adaptable for use in a device-under-test (DUT) power supply 30 (FIG. 2) by automatic test equipment, generally designated 10. The linear amplifier enables the DUT power supply to address the dynamic current needs of a high-speed and high current DUT 40.

Further referring to FIG. 1, the automatic test equipment, or tester, 10 generally includes a computer workstation 12 that couples to a test head 14 via a cable bundle 16. The test head houses a plurality of channel cards (not shown) and power supply boards 22 (only one board shown) in relative close proximity to the DUT 40. The DUT mounts to a device-interface-board 18, often referred to as a "DIB" in packaged-device applications, that interfaces with the test head via a tester interface (not shown) to effect an interconnection of signal, ground and power paths between the tester and the DUT.

Figure 2:
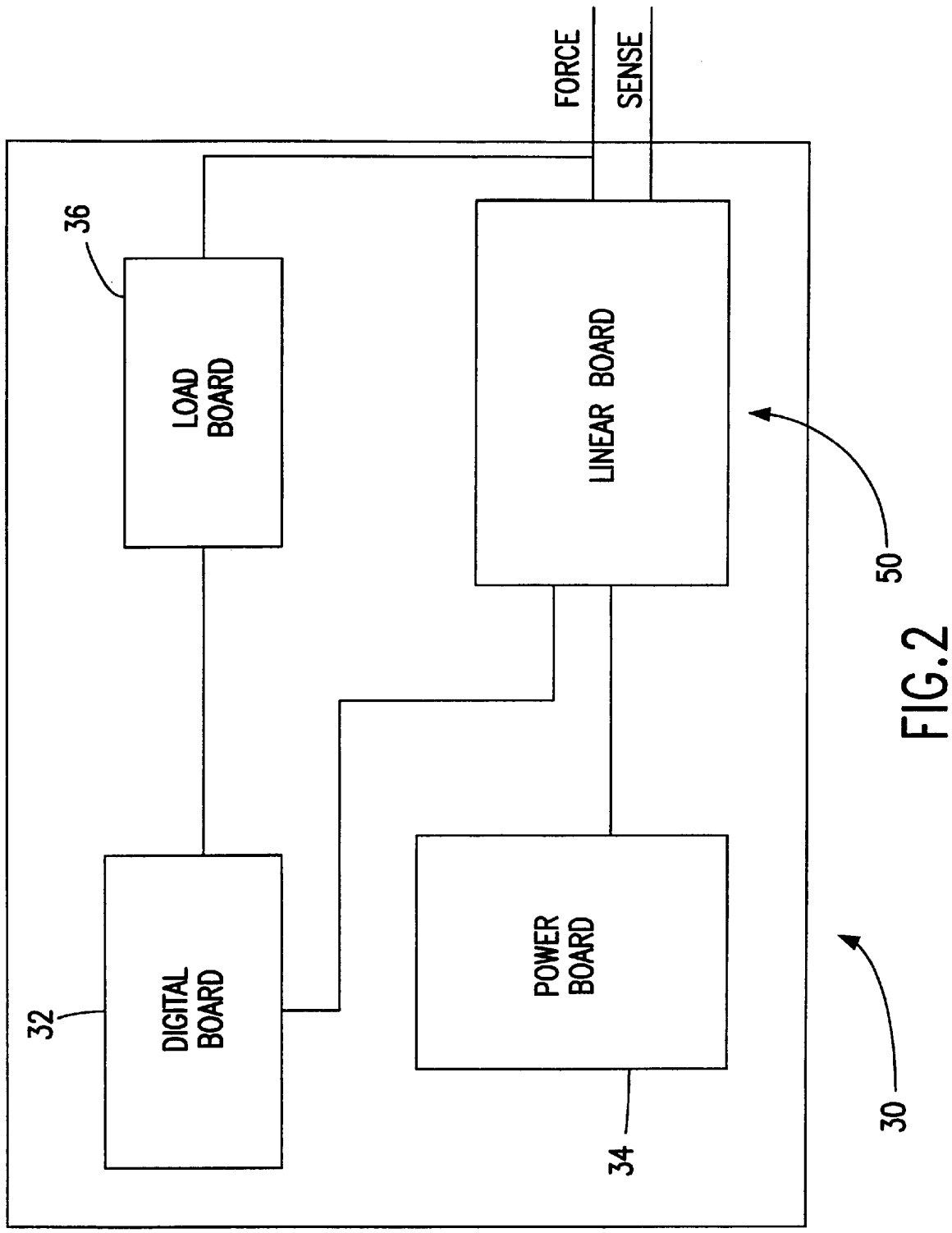
FIG. 2 is a block diagram of a DUT power supply according to one form of the present invention.

With reference to FIG. 2, the DUT power supply 30 that employs the linear amplifier of the present invention includes a digital board 32, a power board 34, and a load board 36 in addition to the linear amplifier 50. This unique overall architecture, including the load board construction, is more fully described in co-pending U.S. application Ser. No. 09/943,275, titled DUT Power Supplies, filed Aug. 30, 2001, assigned to the assignee of the present invention, and expressly incorporated herein by reference. The power board takes the form of a low-noise switching DC-DC converter, as more fully set forth in co-pending U.S. application Ser. No. 09/718,780, titled "Switching DC-DC Converter With Noise Suppression Circuitry", filed Nov. 22, 2000, assigned to the assignee of the present invention, and expressly incorporated herein by reference. The digital board 32 provides a digital-to-analog control interface between the tester and the DUT power supply.

Figure 3:
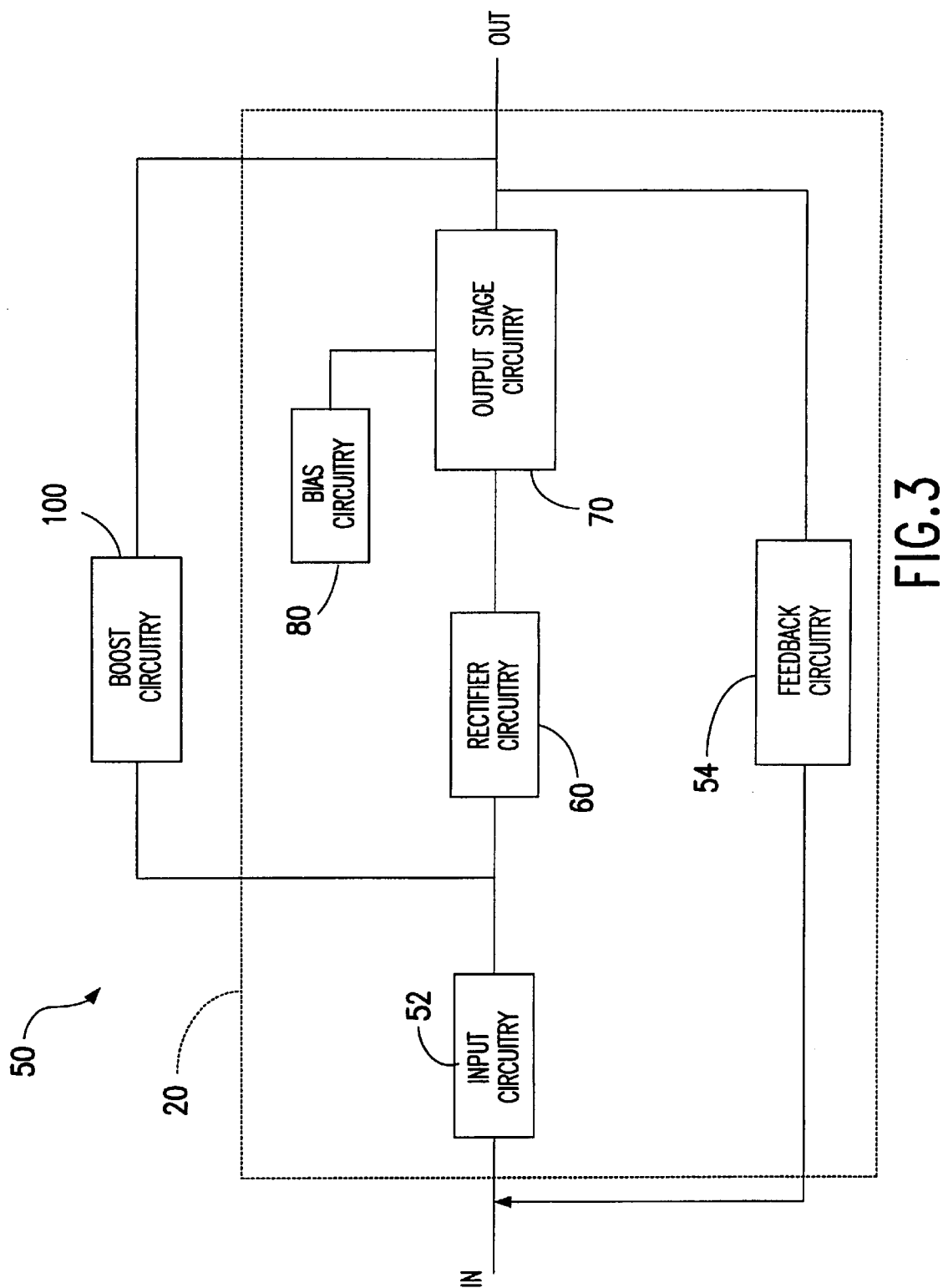
FIG. 3 is a block diagram of the linear amplifier shown in FIG. 2.

Referring now to FIGS. 2 and 3, the linear amplifier 50 couples to the output of the power board 34 and provides high force voltage accuracy, current measurement capability, and current clamping capability. The circuitry generally includes input circuitry 52 that receives a programmed DC voltage from the digital board 32 (FIG. 2), and an error signal from feedback circuitry 54. The feedback circuitry monitors the DC supply output OUT. The input circuitry feeds a command signal to rectifier circuitry 60 that directs the command signal to output stage circuitry 70 to properly source or sink current depending on the requirements of the DUT 40. Bias circuitry 80 biases the output stage circuitry in such a manner as to provide optimum performance and control. Boost circuitry 100 in the form of an AC supply circuit monitors the error signal generated by the feedback circuitry 54. The boost circuitry provides a very high speed current response to the changing dynamic current requirements of the DUT. A preferred construction for the boost circuitry is described in co-pending U.S. patent application Ser. No. 09/718,808, titled "High Speed and High Accuracy DUT Power Supply With Active Boost Circuitry", filed Nov. 22, 2000, assigned to the assignee of the present invention, and expressly incorporated herein by reference.

Figure 4:
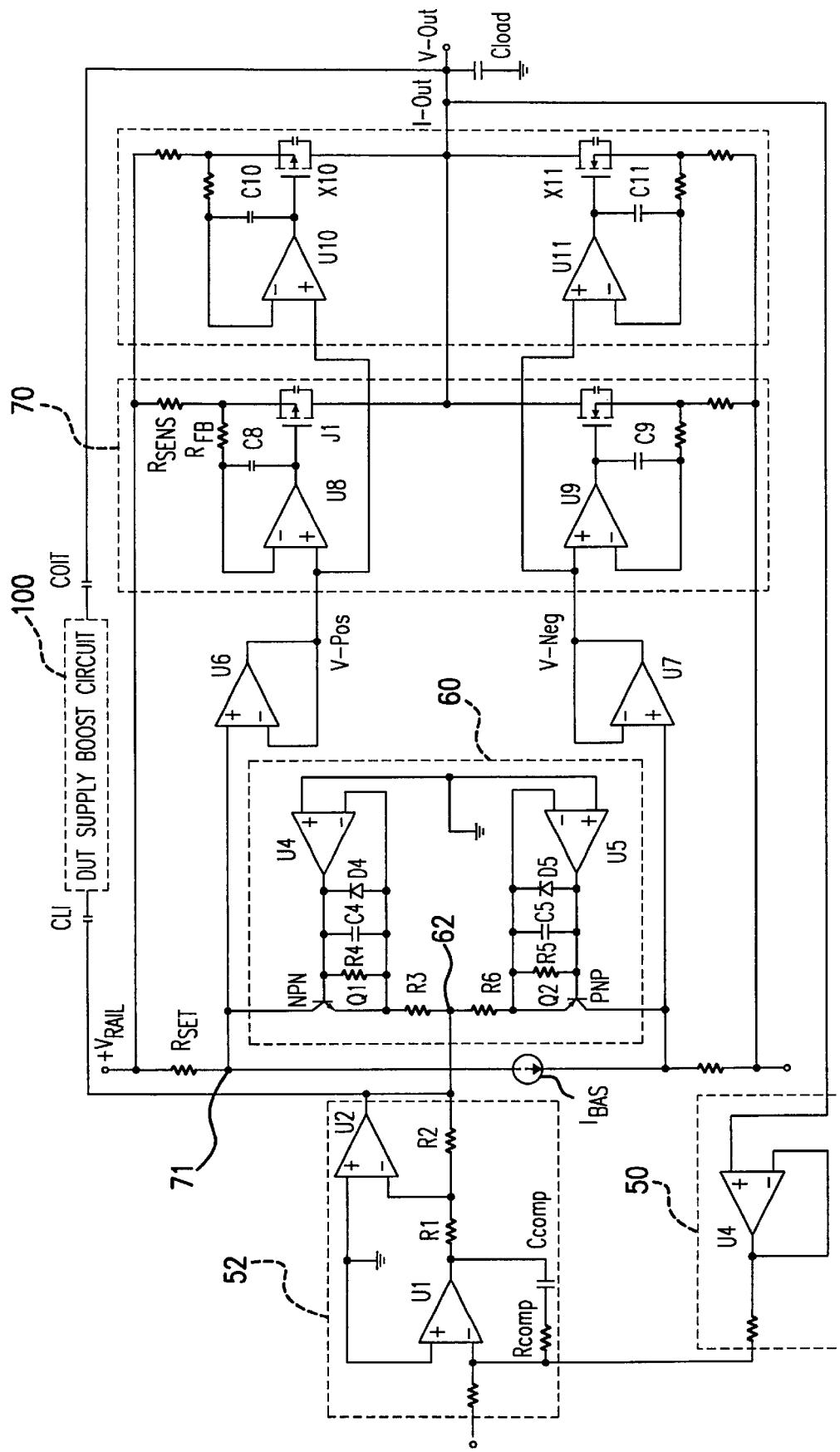
FIG. 4 is a block diagram schematic of the linear amplifier of FIG. 3.

Referring with more particularity now to FIG. 4, the input circuitry 52 (in phantom) comprises a main loop amplifier in the form of an operational amplifier (op amp) U1 and an inverting amplifier U2. Both amplifiers include grounded noninverting (+) inputs that effectively form a virtual ground on the respective inverting (−) terminals. The main loop amplifier includes an input coupled to the output of the feedback circuitry 50 and a negative feedback path formed by a series connection of resistor $R_{comp}$ and capacitor $C_{comp}$. The inverting amplifier also implements resistors R1 and R2 to form a fixed gain and negative feedback path. The output of the inverting amplifier is coupled to the input of the rectifier circuitry 60.

Further referring to FIG. 4, the rectifier circuitry 60 includes respective current source and current sink circuits. The current sink circuit includes an NPN bipolar transistor Q1 with an emitter coupled through a bias resistor R3 to the rectifier input at node 62. The emitter also connects to the inverting terminal of an op amp U4. A ground connection on the noninverting terminal of the op amp effectively places a virtual ground on the transistor emitter. The output of the op amp couples to a parallel bias network of diode D4, capacitor C4 and resistor R4 to control the base of the transistor Q1, and hence the ability to turn on and off (thereby either sinking current or remaining inactive). The transistor collector couples to a positive voltage rail +Vrail through current set resistor Rset to sink a controlled amount of current when activated. The current source circuit is constructed similarly, with a PNP transistor Q2 to source rather than sink current when activated.

With continued reference to FIG. 4, the output stage circuitry 70 is modular in nature to provide a predictable transconductance on the order of, for example, 10 Amps/Volt, per stage. This is accomplished by providing respective source current and sink current paths. For clarity purposes, only the source current path will be described with the understanding that the sink current path is constructed similarly.

Further referring to FIG. 4, the source current path includes a voltage controlled current source in the form of a P-type MOSFET transistor J1, configured in a "common source" arrangement. The transistor gate is controlled by an op amp circuit including op amp U8 having an inverting input coupled across a feedback resistor $R_{FB}$ to the transistor source. An AC coupling capacitor C8 is connected between the op amp output and the feedback resistor $R_{FB}$. The noninverting input of the op amp receives a voltage signal from a buffer amplifier U6 that provides isolation between the output stage circuitry 70 and the rectifier circuitry 60.

The output stage transistor J1 is conveniently maintained in an "always on" 0 state (Class AB) through the implementation of the unique bias circuitry 80 (FIG. 3, with individual components dispersed in FIG. 4). The bias circuitry includes a highly accurate sense resistor $R_{SENS}$ coupled between the source of the transistor and the "+" voltage rail +$V_{RAIL}$. A set resistor $R_{SET}$ is disposed in parallel with the sense resistor at the voltage rail, and coupled to a current bias source $I_{BIAS}$ at a bias node 71.

The buffer amplifier input for op amp U6, and the rectifier collector for transistor Q1 are also connected to the bias node.

Figure 5:
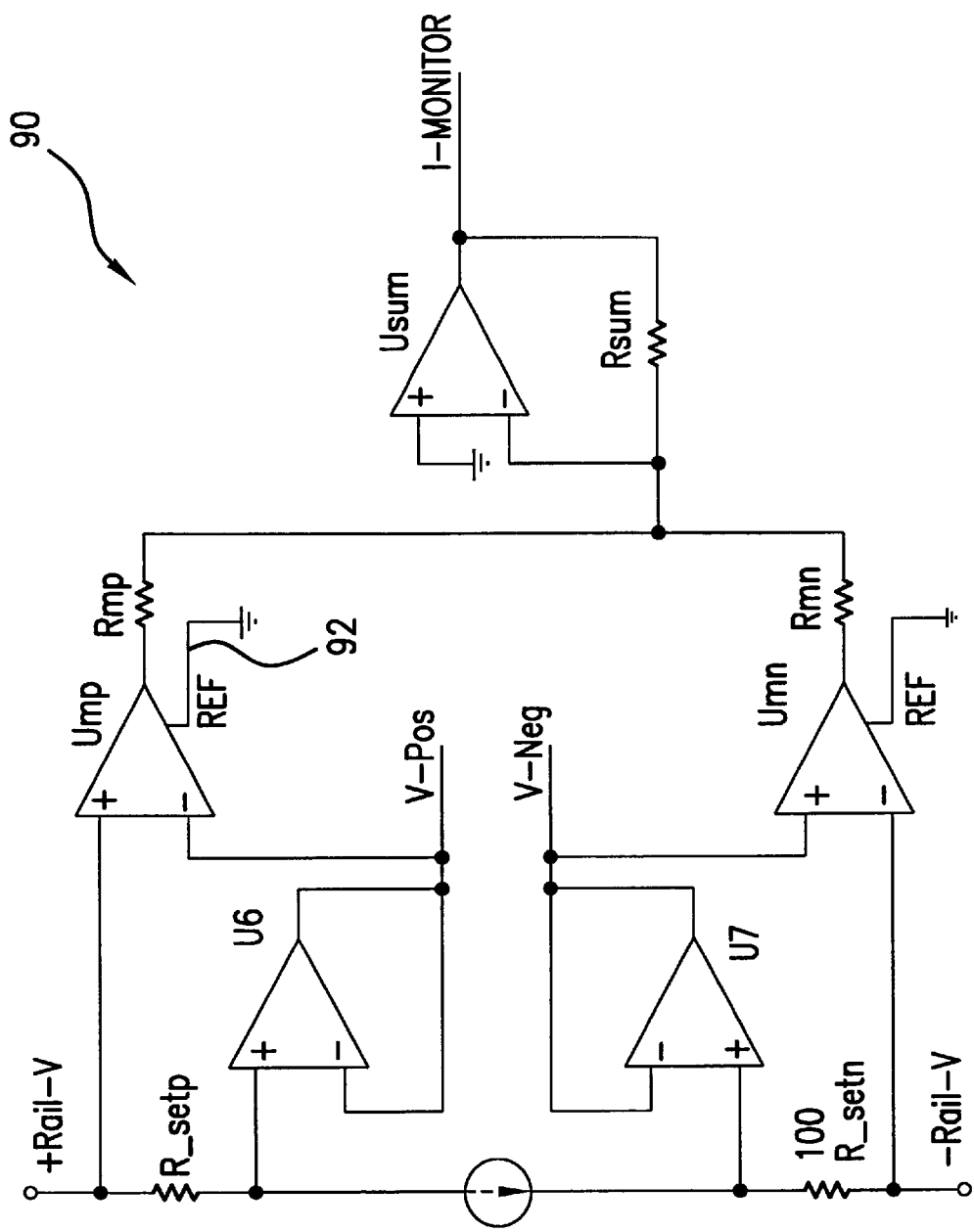
FIG. 5 is a block diagram schematic of an indirect current monitoring circuit for use in the linear amplifier of FIG. 3.

With reference now to FIG. 5, the construction of the linear amplifier described above allows for a convenient way to monitor current levels without directly loading the output with an inductive component. The indirect current monitoring circuit, generally designated 90, includes respective sink and source current monitoring paths having outputs that are summed at a summing op amp $U_{SUM}$ to subtract bias current, thereby producing an output proportional to the load current. The source current monitoring path includes a first instrumentation amplifier Ump having its noninverting input coupled to the +rail and its inverting input connected to the output of op amp U6 (this output is the drop across Rsetp). The output from the instrumentation amplifier is ground referenced at 92 and scaled to represent the total current in the output stage source FET (plus the bias circuitry). The sink current monitor path is formed similar, but coupled to the "−" rail voltage and the Vneg terminal. The indirect nature of the current monitoring circuit has the advantage of minimizing undesirable inductive and resistive effects at the output OUT of the supply circuitry.

Figure 6:
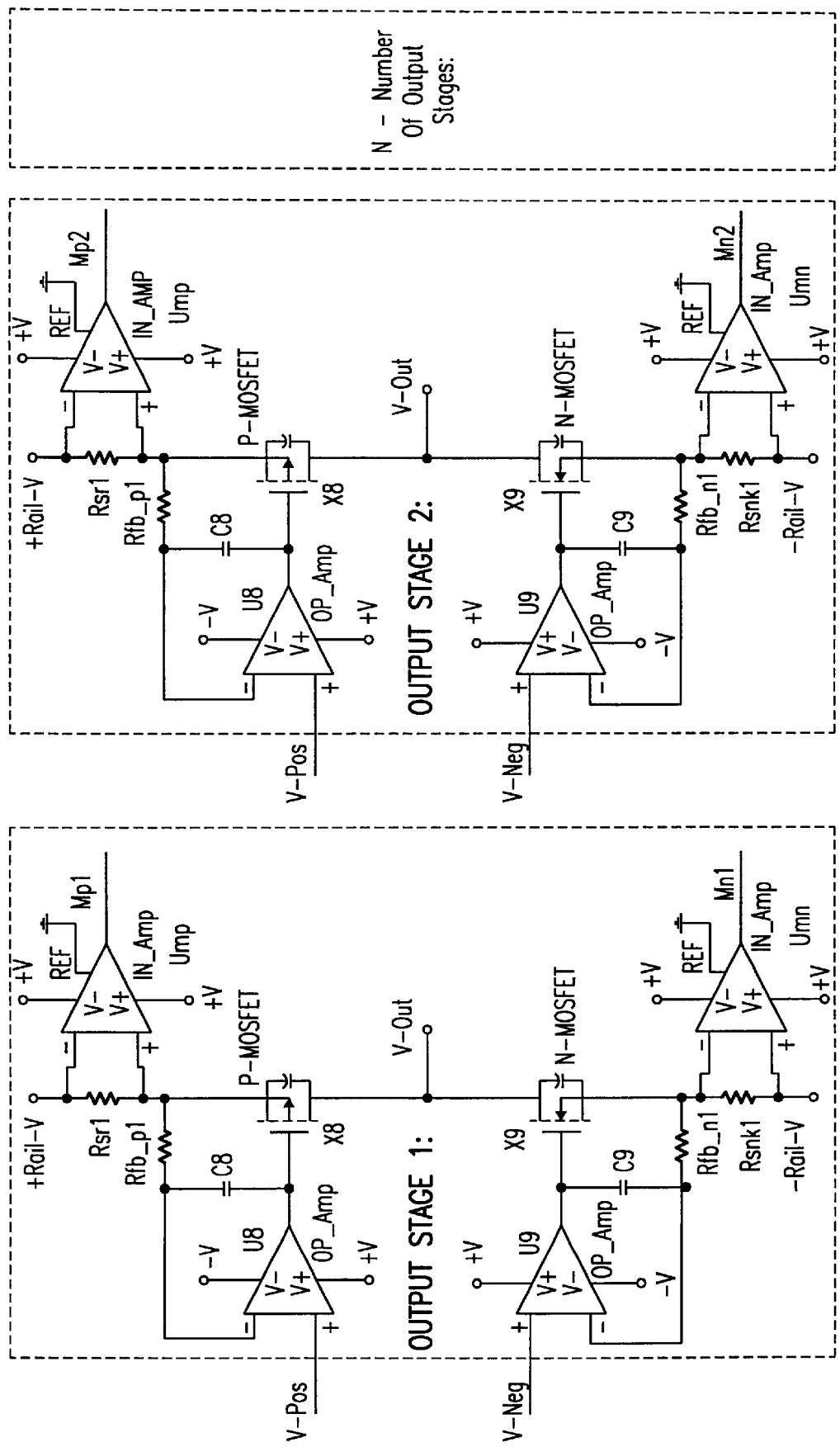
FIGS. 6 and 7 are block diagram schematics of an alternative current monitoring scheme for use with the linear amplifier of FIG. 3.
Figure 7:
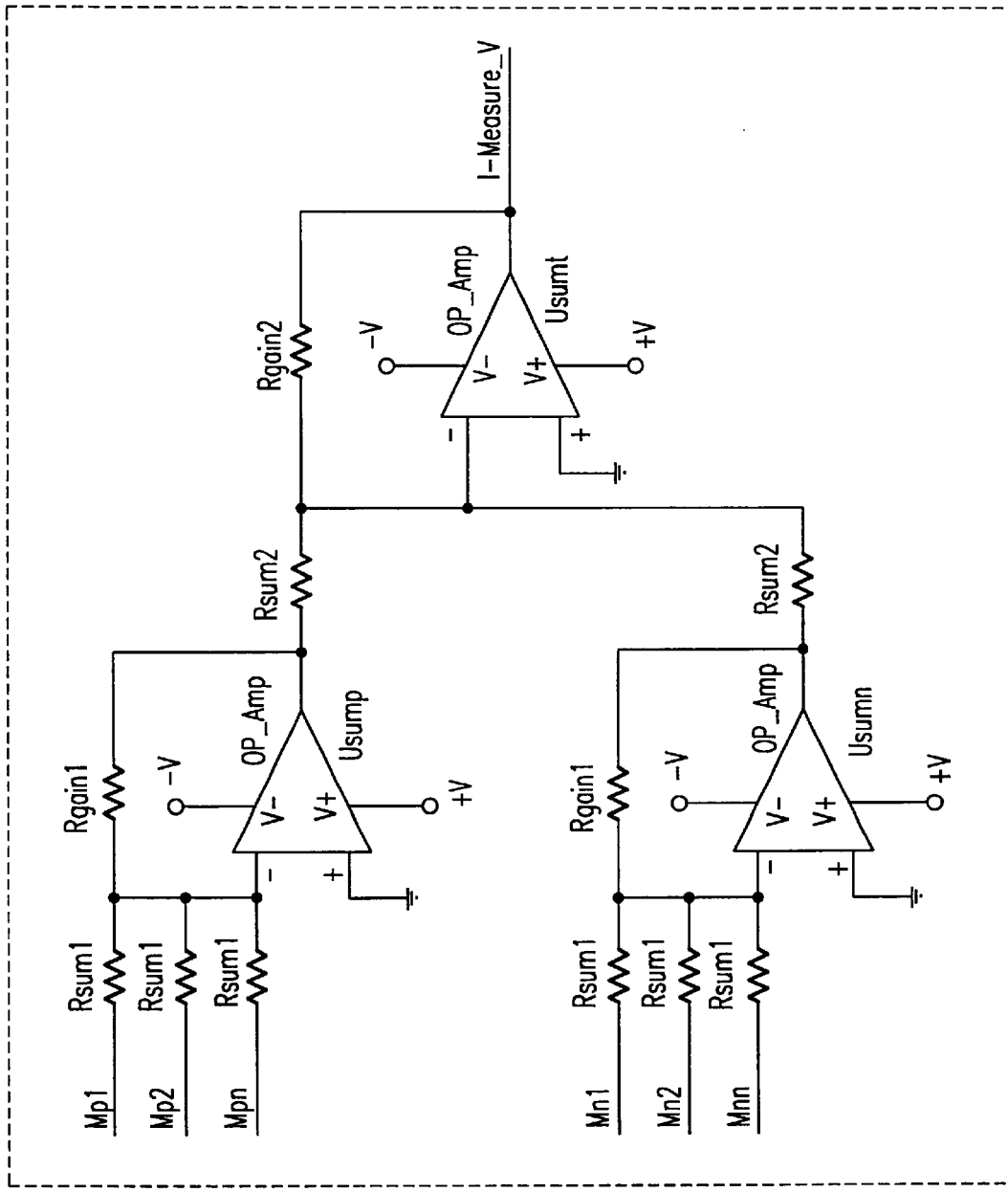

An alternative embodiment to the indirect current monitoring circuit comprises a more direct approach, illustrated in FIGS. 6 and 7. The circuit employs a separate instrumentation amplifier N_AMP for each output stage transistor. Each instrumentation amplifier has its inputs coupled across each output stage sense resistor RSENS. The resulting outputs from each like-polarity instrumentation amplifier are coupled in parallel to the input of a first summing amplifier USUMP (and for the sink path USUMN). Each summing amplifier includes resistor RGAIN1 to set an output gain proportional to the summed input voltage. The outputs from the two summing amplifiers are then fed to an overall summing amplifier USUMT to eliminate the bias component of the current. This distributed method of monitoring current provides a more "direct" form of measuring the current output without having to use overly large and undesirably inductive sense resistors at the output of the linear amplifier.

In operation, the bias circuitry 80 establishes an optimum DC bias condition for the output stage circuitry 70. The bias current source creates a voltage drop across RSET, which is detected and passed through the buffer amplifier U6, to the output stage op amp U8. The op amp U8 then regulates the drop across the sense resistor RSENS, thereby regulating the bias current in the output transistor. The mirror of this circuitry establishes the bias for the sink current output N-FETs. This bias current is independent of the drive current, load current, and FET heating with load.

Those skilled in the art will recognize that the biasing of the output stages provides a fast response to the rapid current changes of the DUT. The voltage at the DUT 40 is detected and fed back to the DC power supply circuitry 20 via the DC sense line 26 for monitor and control purposes.

As the DUT demands more or less current, the linear amplifier sense line detects the resulting voltage droop with the feedback circuitry 50 and feeds an error signal to the input circuitry 52. The input circuitry conditions the signal as a command signal for application to the rectifier circuitry 60 at node 62. For sensed droop conditions, the polarity of the command signal is negative, thereby forward biasing the NPN transistor Q1, and activating the current source circuitry. The buffer amplifier U6 detects the source circuitry activation to drive the source path circuitry of the output circuitry 70. Since the bias circuitry 80 maintains each FET transistor in an "on" condition, the response of the current is relatively fast for a DC-type supply. The additional current is then "sourced" to the output OUT. The feedback loop monitors and adjusts the current level for the desired DUT voltage.

Figure 8:
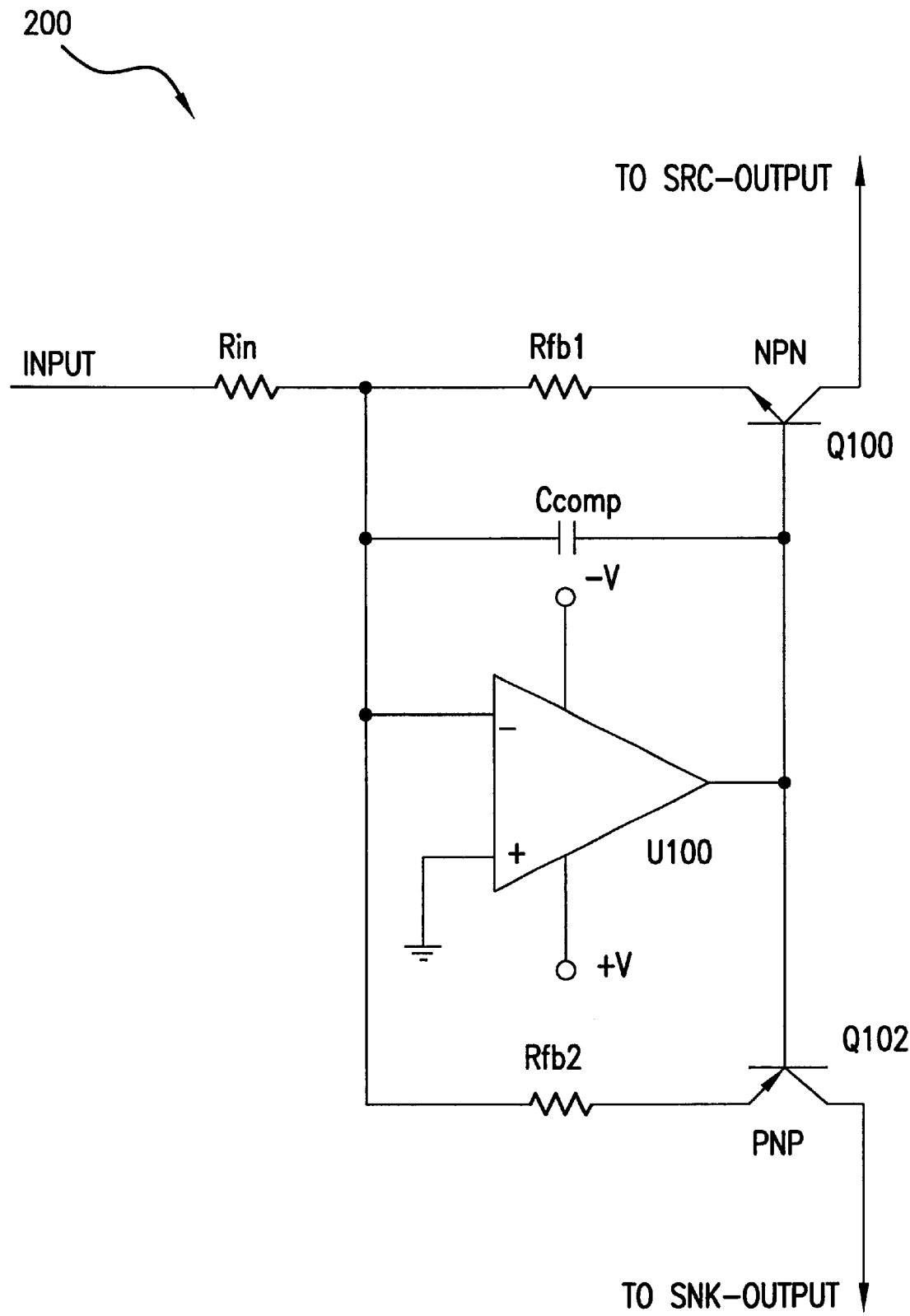
FIG. 8 is a block diagram schematic for an alternative rectifier circuit for use in the linear amplifier of FIG. 3.

Referring now to FIG. 8, in an alternative embodiment, the linear amplifier implements rectifier circuitry 200 that employs only a single op amp U100. The op amp includes a grounded non-inverting input and an output to drive either an NPN source transistor Q100 (biased by Rfb1) or a PNP sink transistor Q102 (biased by resistor Rfb2), depending on the polarity of the command signal at the resistor Rin. All other aspects of the DC supply circuitry remain substantially similar to the previously described embodiment.

Figure 9:
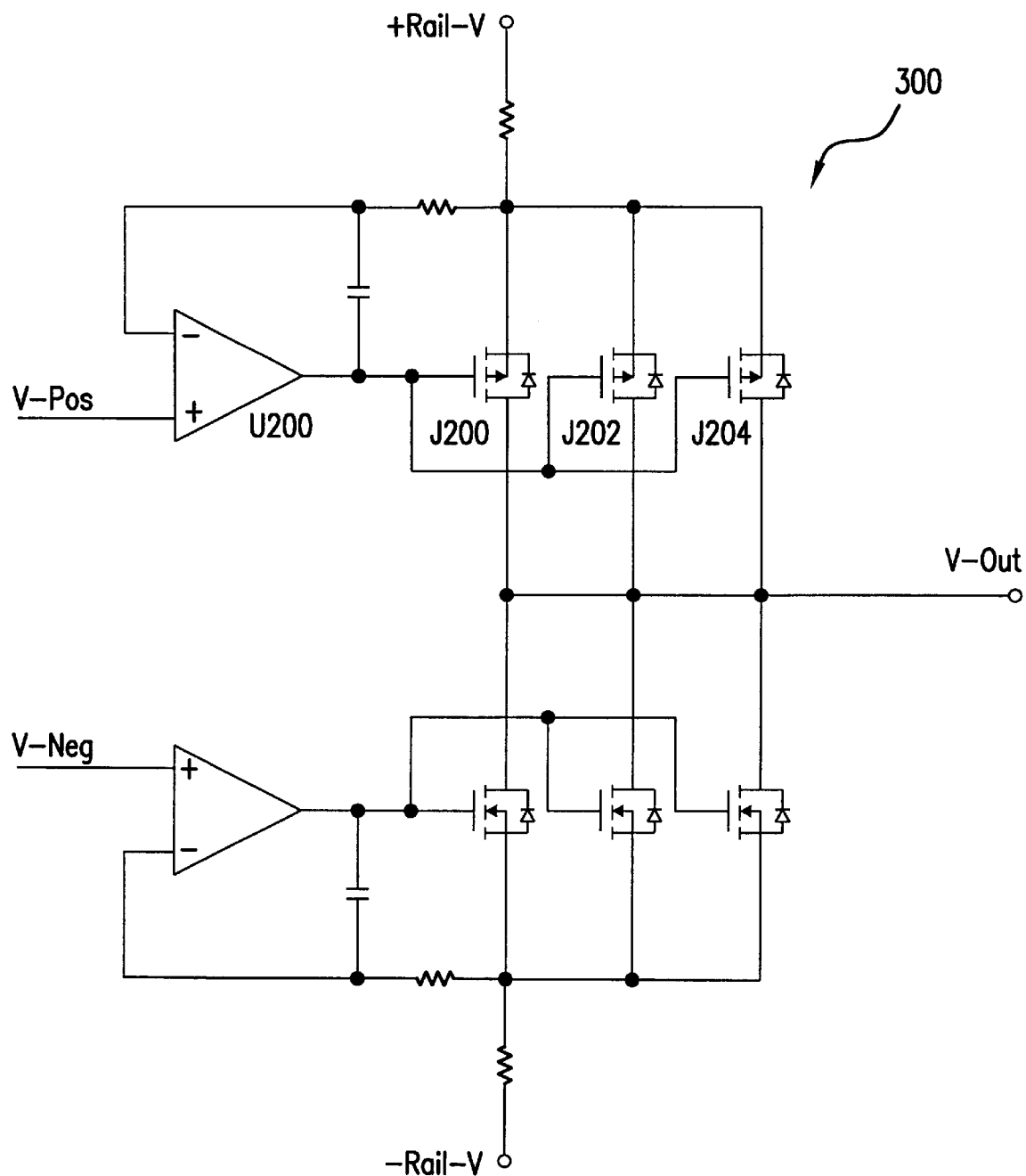
FIG. 9 is a block diagram schematic for an alternative output stage circuit for use in the linear amplifier of FIG. 3.

A further variation to the linear amplifier, shown in FIG. 9, involves an alternative output stage circuitry 300. Rather than "gang" a plurality of output modules (each including an op-amp paired with an FET transistor), a single op-amp U200 for each path (source or sink) controls a plurality of matched FET's J200, J202, J204 coupled in parallel. An advantage to this scheme is the additional reliability brought about by redundancy should one of the FET's fail.

Those skilled in the art will appreciate the numerous benefits and advantages afforded by the present invention. The linear amplifier construction disclosed herein provides highly accurate current sink and source capability while maintaining state-of-the-art performance. The unique FET bias and rectifier circuitry allows the modular transconductance output stage transistors to remain in a ready "on" state, maximizing both accuracy and performance while minimizing power dissipation. Moreover, the indirect current monitoring capability also lends itself well to high speed applications by reducing the number of inductive components.

While the invention has been particularly shown and described with reference to the preferred embodiments thereof, it will be understood by those skilled in the art that various changes in form and detail may be made therein without departing from the spirit and scope of the invention. For example, while the present invention has been described in detail for use in packaged-device level applications, minor modifications could be made to employ the power supply in wafer-probe applications. In such applications, device boards take the form of probecards.

What is claimed is:

1. A high-accuracy linear amplifier for sinking or sourcing current to or from a load, said linear amplifier including:

input circuitry for receiving a predetermined input signal;

rectifier circuitry disposed at the output of said input circuitry and operative in response to said input signal to generate a source/sink command signal;

output stage circuitry coupled to said rectifier circuitry and including a current sink transistor and a current source transistor, said output stage circuitry responsive to said command signal to sink or source current through one of said respective transistors;

feedback circuitry coupled between the output of said output stage circuitry and said input circuitry to provide an error signal for modifying said input signal; and bias circuitry to maintain the non-conducting transistor in an on state during the sourcing or sinking of current.

2. A high-accuracy linear amplifier according to claim 1 and further including:

high-speed boost circuitry coupled between said output stage output and said rectifier input.

3. A high-accuracy linear amplifier according to claim 1 wherein said rectifier circuitry includes:

a current source path including said current source transistor;

a current sink path including said current sink transistor; and op amp circuitry coupled to said paths to establish a common node between said transistors, said respective source and sink transistors operative in response to said command voltage to cause current flow through one of said paths depending on the polarity of said command signal.

4. A high-accuracy linear amplifier according to claim 3 wherein:

said current source and sink paths are disposed in series, and said op amp circuitry comprises first and second op amps associated respectfully with said current source path and said current sink path.

5. A high-accuracy linear amplifier according to claim 3 wherein:

said current source and sink paths are disposed in parallel, and said op amp circuitry comprises a first op amp coupled to both paths.

6. A high-accuracy linear amplifier according to claim 1 wherein said output stage circuitry includes:

respective source current and sink current paths, said paths including respective source and sink transistors disposed in a common-source configuration and respective source and sink impedances to generate a predetermined transconductance; and respective source current and sink current op amps coupled to said respective source current and sink current transistors, each of said op amps responsive to a command signal to source or sink current through said source or sink transistors.

7. A high-accuracy linear amplifier according to claim 6 wherein:

each of said paths include a single FET in series with said impedance.

8. A high-accuracy linear amplifier according to claim 6 wherein:

each of said paths include a plurality of FETs disposed in parallel, and collectively connected in series with said impedance.

9. A high-accuracy linear amplifier according to claim 1 wherein said bias circuitry includes:

a voltage rail;

a set resistor coupled to said voltage rail;

a current source disposed in series with said set resistor to establish a fixed voltage drop across said set resistor;

a sense resistor disposed between said voltage rail and said FET source terminal; and an op amp having a positive input coupled to said fixed voltage drop, a negative input coupled in a feedback path to said FET source terminal and an output coupled to said FET gate terminal, said op amp operative to control the voltage across said sense resistor, whereby the bias current generated in said FET is independent of drive current, load current and FET heating.

10. A DUT power supply for use with automatic test equipment, said DUT power supply including:

a digital controller;

a switching DC-DC converter; and a linear amplifier, said linear amplifier including input circuitry for receiving a predetermined input signal; rectifier circuitry disposed at the output of said input circuitry and operative in response to said input signal to generate a source/sink command signal;

output stage circuitry coupled to said rectifier circuitry and including a current sink transistor and a current source transistor, said output stage circuitry responsive to said command signal to sink or source current through one of said respective transistors;

feedback circuitry coupled between the output of said output stage circuitry and said input circuitry to provide an error signal for modifying said input signal; and bias circuitry to maintain the non-conducting transistor in an on state during the sourcing or sinking of current.

11. A DUT power supply according to claim 10 and further including:

a load board coupled to said digital controller and said linear amplifier.

12. A DUT power supply according to claim 10 wherein said linear amplifier further includes:

high-speed boost circuitry coupled between said output stage output and said rectifier input.

13. A bias circuit for maintaining a linear amplifier output stage in an on state, said power supply output stage including an FET with respective gate, drain, and source terminals and configured as a common-source amplifier, said bias circuit including:

a voltage rail;

a set resistor coupled to said voltage rail;

a current source disposed in series with said set resistor to establish a fixed voltage drop across said set resistor;

a sense resistor disposed between said voltage rail and said FET source terminal; and an op amp having a positive input coupled to said fixed voltage drop, a negative input coupled in a feedback path to said FET source terminal and an output coupled to said FET gate terminal, said op amp operative to cooperate with said current source to control the voltage across said sense resistor, whereby the bias current generated in said FET is independent of drive current, load current and FET heating.

14. A rectifier circuit for directing a command voltage to source or sink current to or from respective source or sink FET output stage transistors, said rectifier circuit including:

a current source path including a current source transistor;

a current sink path including a current sink transistor; and op amp circuitry coupled to said paths to establish a common node between said transistors, said respective source and sink transistors operative in response to said command voltage to cause current flow through one of said paths depending on the polarity of said command signal.

15. A rectifier circuit according to claim 14 wherein:

said current source and sink paths are disposed in series, and said op amp circuitry comprises first and second op amps associated respectfully with said current source path and said current sink path.

16. A rectifier circuit according to claim 14 wherein:

said current source and sink paths are disposed in parallel, and said op amp circuitry comprises a first op amp coupled to both paths.

17. A modular output stage for use in a linear amplifier, said modular output stage including:

respective source current and sink current paths, said paths including respective source and sink transistors disposed in a common-source configuration and respective source and sink impedances to generate a predetermined transconductance; and respective source current and sink current op amps coupled to said respective source current and sink current transistors, each of said op amps responsive to a command signal to source or sink current through said source or sink transistors.

18. A modular output stage according to claim 17 wherein:

each of said paths include a single FET in series with said impedance.

19. A modular output stage according to claim 17 wherein:

each of said paths include a plurality of FETs disposed in parallel, and collectively connected in series with said impedance.

20. An indirect current monitor circuit for indicating changes in current output from a device-under-test power supply, said power supply having respective positive and negative voltage rails, at least one output stage, and bias circuitry for biasing said output stage, said indirect current monitor circuit including:

a first instrumentation amplifier coupled to said positive bias circuitry;

a second instrumentation amplifier coupled to said negative bias circuitry; and a summing amplifier having an input coupled to the outputs of said first and second instrumentation amplifiers for detecting changes in current in said positive and negative bias circuits, whereby said changes in current in said bias circuits represent changes in current from said at least one output stage.

* * * * *